(12) United States Patent
Chen

(10) Patent No.: US 10,070,555 B1
(45) Date of Patent: Sep. 4, 2018

(54) INSERTABLE FIXING MODULE OF CABINET RAIL

(71) Applicant: MARTAS PRECISION SLIDE CO., LTD., New Taipei (TW)

(72) Inventor: Wan-Lai Chen, New Taipei (TW)

(73) Assignee: Martas Precision Slide Co., Ltd., New Taipei (TW)

( * ) Notice: Subject to any disclaimer, the term of this patent is extended or adjusted under 35 U.S.C. 154(b) by 0 days.

(21) Appl. No.: 15/691,988

(22) Filed: Aug. 31, 2017

(51) Int. Cl.
*H05K 7/14* (2006.01)
*A47B 88/417* (2017.01)

(52) U.S. Cl.
CPC ......... *H05K 7/1489* (2013.01); *A47B 88/417* (2017.01); *H05K 7/1474* (2013.01); *A47B 2210/0051* (2013.01); *H05K 7/1428* (2013.01)

(58) Field of Classification Search
CPC .. H05K 7/1489; H05K 7/1474; H05K 7/1428; A47B 88/417; A47B 2210/0051
See application file for complete search history.

(56) References Cited

U.S. PATENT DOCUMENTS

| | | | | |
|---|---|---|---|---|
| 8,870,311 | B2 * | 10/2014 | Chang | H05K 7/1489 312/334.4 |
| 9,125,489 | B2 * | 9/2015 | Chen | A47B 88/044 |
| 9,642,281 | B1 * | 5/2017 | Chen | H05K 7/1489 |
| 9,743,767 | B1 * | 8/2017 | Easton | A47B 88/43 |
| 2012/0134743 | A1 * | 5/2012 | Yu | H05K 7/1489 403/330 |
| 2013/0056432 | A1 * | 3/2013 | Lin | H05K 7/1489 211/123 |
| 2014/0132139 | A1 * | 5/2014 | Chang | H05K 7/183 312/333 |
| 2014/0363108 | A1 * | 12/2014 | Chen | A47B 88/044 384/22 |
| 2014/0363109 | A1 * | 12/2014 | Chen | A47B 88/044 384/22 |
| 2015/0048041 | A1 * | 2/2015 | Chuang | H05K 7/1489 211/175 |
| 2015/0048227 | A1 * | 2/2015 | Chuang | F16B 9/023 248/228.4 |
| 2015/0181753 | A1 * | 6/2015 | Murakami | H05K 7/1489 211/26 |
| 2015/0189989 | A1 * | 7/2015 | Chen | H05K 7/1489 248/201 |
| 2015/0201754 | A1 * | 7/2015 | Chen | A47B 96/025 248/219.3 |

(Continued)

*Primary Examiner* — Hanh V Tran
(74) *Attorney, Agent, or Firm* — Rosenberg, Klein & Lee

(57) ABSTRACT

An insertable fixing module of an industrial cabinet rail includes a main body, a hook, a linking slider and a press key, and the rail is installed in the industrial cabinet. The hook is installed in the linking slider. With the design of a slop pushing between the linking slider and the press key, an inverted hook portion of the hook is latched into a latching hole of a frame. In the present invention, the press key is situated on the inner side of the frame to prevent from being touched accidentally. During installation, the fixing module can be inserted and fixed. During removal, the press key is pushed along the extending direction of the rail, so that the hook can be withdrawn to remove the rail. The invention improves the stability of installation and the convenience of installation and removal.

7 Claims, 5 Drawing Sheets

(56) References Cited

U.S. PATENT DOCUMENTS

| | | | |
|---|---|---|---|
| 2016/0157610 A1* | 6/2016 | Chen .................. | H05K 7/1489 |
| | | | 248/219.3 |
| 2016/0309607 A1* | 10/2016 | Hsu .................... | H05K 7/1489 |
| 2016/0324317 A1* | 11/2016 | Chen .................. | H05K 7/1489 |
| 2016/0345453 A1* | 11/2016 | Zhang ................ | H05K 5/0234 |
| 2017/0055707 A1* | 3/2017 | Chen .................. | A47B 88/407 |
| 2017/0181543 A1* | 6/2017 | Chen .................. | A47B 96/068 |

* cited by examiner

INSERTABLE FIXING MODULE OF CABINET RAIL

FIELD OF INVENTION

The present invention relates to the field of industrial computer cabinets in particular to an insertable fixing module of an industrial cabinet rail which can be inserted and installed from inside to outside for a quick installation or removal, and can prevent its falling off accidentally by an inappropriate contact.

BACKGROUND OF INVENTION

1. Description of the Related Art

In general, an industrial computer is installed into an industrial cabinet horizontally, and the industrial cabinet has a support frame vertically erected from each of the four corners, and a plurality of fixing holes or screw holes formed on each frame and arranged with an interval apart from each other, and then fixed by a fixing block or a fixing screw, so that the industrial computers can be vertically stacked into the industrial cabinet.

When the conventional industrial computer is maintained or repaired, it is necessary to remove the aforementioned fixing block or fixing screw for the maintenance and repair. Obviously, such arrangement has the drawbacks of wasting much effort and time, and causing tremendous inconvenience to operator and maintenance people. Therefore, related manufacturers introduced an installation method using rails instead of the conventional fixing blocks or fixing screws, and the rail with characteristic capable of being pulled, stacked, and contracted provides a perfect solution for the insufficient working environment, so that the industrial computers can be pushed into the industrial computer cabinet easily, or the industrial computers can be selectively pulled out from the industrial computer cabinet for expansion, replacement or maintenance, and thus improving the convenience of maintenance and repair significantly.

However, the installation of rails of this sort requires a latching set installed at both ends of the rail separately for passing through the two fixing holes at a corresponding height of two opposite frames in order to achieve the spanning form, and the weight of the industrial computer is used to press the latching set in order to maintain the rail to be fixed with the frame and improve the convenience of installation or removal. However, the fixture simply relies on the pressing of the weight may have a risk of separating the rails to damage the industrial computers when the industrial computer cabinet is shaken severely or tumbled. Therefore, the fixing modules of this sort require screws for fixing to improve stability, but such arrangement will make removal inconvenient. In recent years, some manufacturers have designed and developed a fixing module with an automatic locking function, and a special design of hooks is used to accomplish locking the fixing modules in position automatically without requiring any screw. Since the structure is too complicated and the cost is increased, such conventional fixing module requires improvements.

Therefore, the inventor of the present invention based on years of experience of the related industry to conduct extensive research and experiment, and finally developed an insertable fixing module of an industrial cabinet rail, wherein the structure is simplified, and the separation of the assembled parts can be prevented, so as to improve the practicality. As to operators and maintenance technicians, the removal and installation become very convenient, and the convenience of use is improved.

2. Summary of the Invention

Therefore, it is a primary objective of the present invention to provide an insertable fixing module of an industrial cabinet rail, wherein a press key is provided for pushing a linking slider to control the operation of a hook installed in a main body to fix the rail to a computer cabinet or remove the rail from the computer cabinet, and the invention achieves the effect of improving the efficiency and stability of the installation.

To achieve the aforementioned and other objectives, the present invention provides an insertable fixing module of an industrial cabinet rail, wherein the industrial cabinet has a frame installed at four corners of the industrial cabinet separately, and each vertically erected frame has a plurality of latching holes arranged with an interval apart from one another, and the fixing module is installed at an end of a rail facing the outer side of the industrial cabinet, and the fixing module is installed horizontally between frames, and the insertable fixing module comprises: a main body, fixed to a front end portion of the rail, and having a pair of positioning bumps configured to be corresponsive to the latching holes respectively and arranged with an interval apart from each other, an accommodating space formed inside the main body, and a chute extended from one of the positioning bumps in an axial direction, so that the chute and the accommodating space are communicated with each other; a hook, movably installed in the chute, and having at least one inverted hook portion disposed at an end of the hook and configured to be corresponsive to the latching hole, and the other end of the hook being extended into the accommodating space to form a junction; a linking slider, movably installed in the accommodating space, and having a combination slot configured to be corresponsive to the hook and disposed at the front end of the linking slider, and the junction of the hook being installed into the combination slot, a spring installed to the top side of the linking slider for abutting a side of the accommodating space and abutting the linking slider to expose the inverted hook portion of the hook from the positioning bump, and the linking slider having a linking slope, and the direction of the linking slope being corresponsive to the contraction direction of the spring; and a press key, movably installed in the accommodating space, and having a driving slope configured to be corresponsive to the linking slope, so that the press key is disposed on a side of the linking slider, and the direction of the driving slope being configured to be corresponsive to the moving direction of the linking slider, and the moving direction of the press key being configured to be corresponsive to the extending direction of the rail; thereby, during installation, the pair of positioning bumps are inserted into the two latching holes respectively, and the hook is provided and popped out to define a latched status of fixing the frame; and after the press key is pushed inwardly along the extending direction of the rail, the hook is withdrawn into the positioning bump to define a released status.

In a preferred embodiment, each positioning bump has a two-stage design formed by stacking a first positioning portion and a second positioning portion, and the first positioning portion is corresponsive to the latching holes and substantially a rectangular block structure, and the second positioning portion is substantially a cylindrical structure corresponsive to the latching holes, and the first positioning portion has a volume greater than the volume of the second positioning portion, so that the first positioning portion can be installed into a circular or rectangular latching hole. In addition, the hook has two inverted hook portions corresponsive to the positioning bump, and the inverted hook portions are corresponsive to the first positioning portion and the second positioning portion respectively, so as to improve the fixing effect after the installation. In addition, the insertable fixing module of an industrial cabinet rail in accordance with the present invention further comprises an auxiliary positioning column installed on a side of the two positioning bumps opposite to the main body, and disposed between the two positioning bumps, so that the positioning effect and stability of the installation can be improved.

In another preferred embodiment, the main body has an operating window formed on a surface of the main body and configured to be corresponsive to the moving space of the press key, so that a portion of the press key is exposed from the operating window, especially from the side corresponsive to the rail. Since a portion of the press key is exposed from the main body has an operating window formed on a surface of the main body and configured to be corresponsive to the moving space of the press key, so that a portion of the press key is exposed from the operating window, especially from a side of the rail. Since a portion of the press key is exposed from the operating window, therefore the release operation becomes more convenient.

In addition, the insertable fixing module of an industrial cabinet rail in accordance with the present invention further comprises a fixing rack made by bending a metal plate, and an end of the fixing rack having a plurality of first fixing holes configured to be corresponsive to the rail and provided for fixing to the front end of the rail, and the other end of the fixing rack having a groove formed and configured to be corresponsive to the main body, and the groove having a plurality of second fixing holes formed inside the groove and configured to be corresponsive to the main body for fixing the main body into the groove. In addition, the groove has two positioning plates formed on a side of the groove and bent and extended from the main body, and each fixing plate has a positioning hole, and the main body has two positioning columns configured to be corresponsive to the two fixing holes, and during installation, the two fixing columns are inserted into the two fixing plates respectively to improve the stable effect.

DESCRIPTION OF THE PREFERRED EMBODIMENTS

Figure 1:
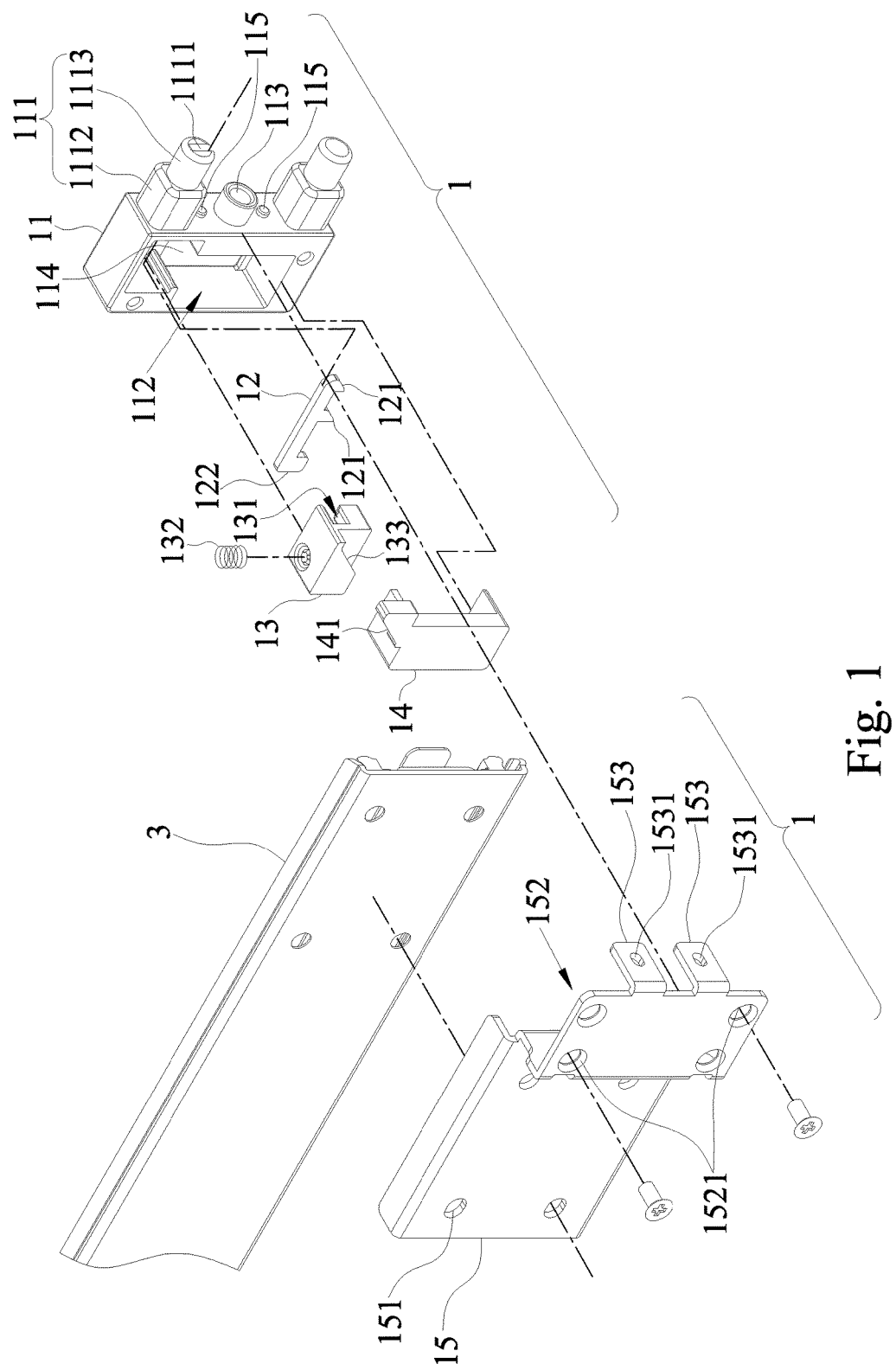
FIG. 1 is an exploded view of a preferred embodiment of the present invention.
Figure 2:
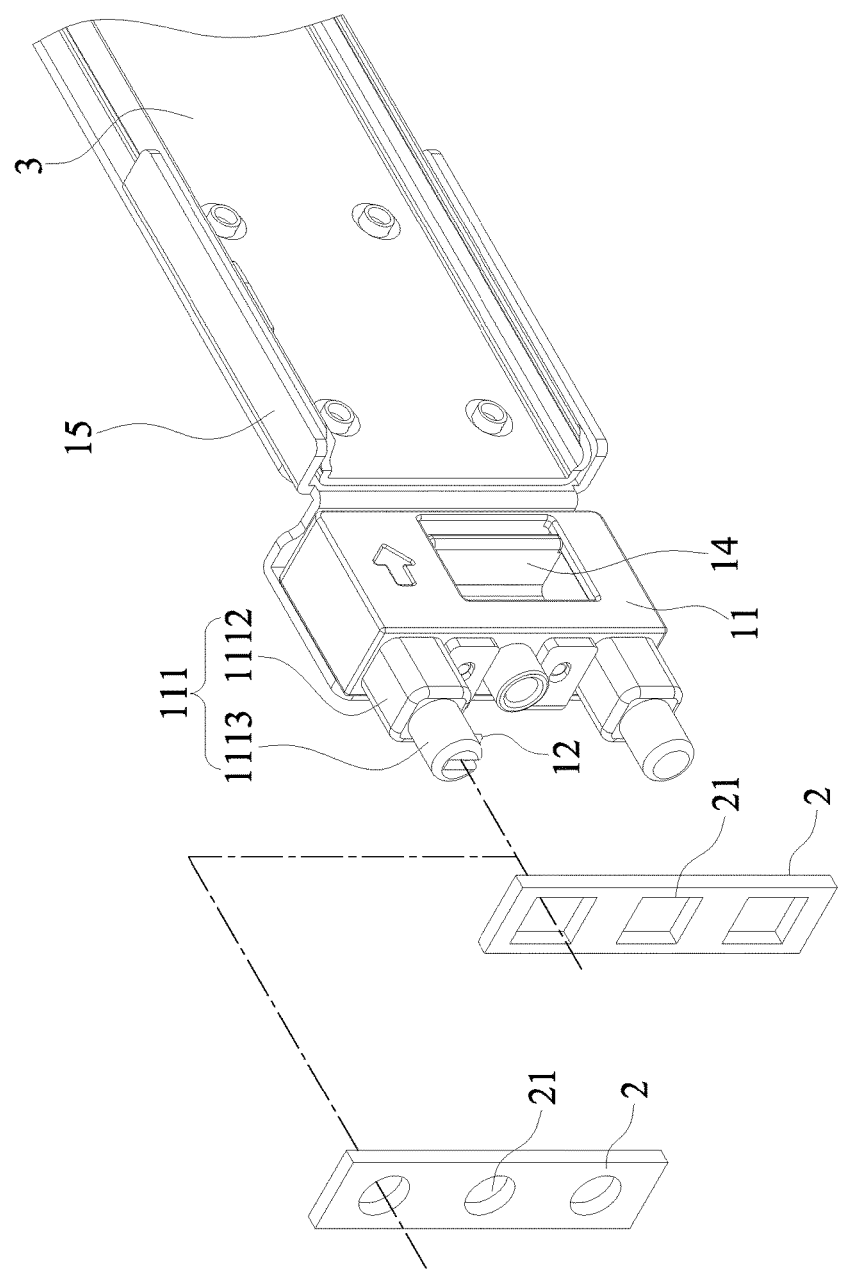
FIG. 2 is a perspective view of a preferred embodiment of the present invention.
Figure 3:
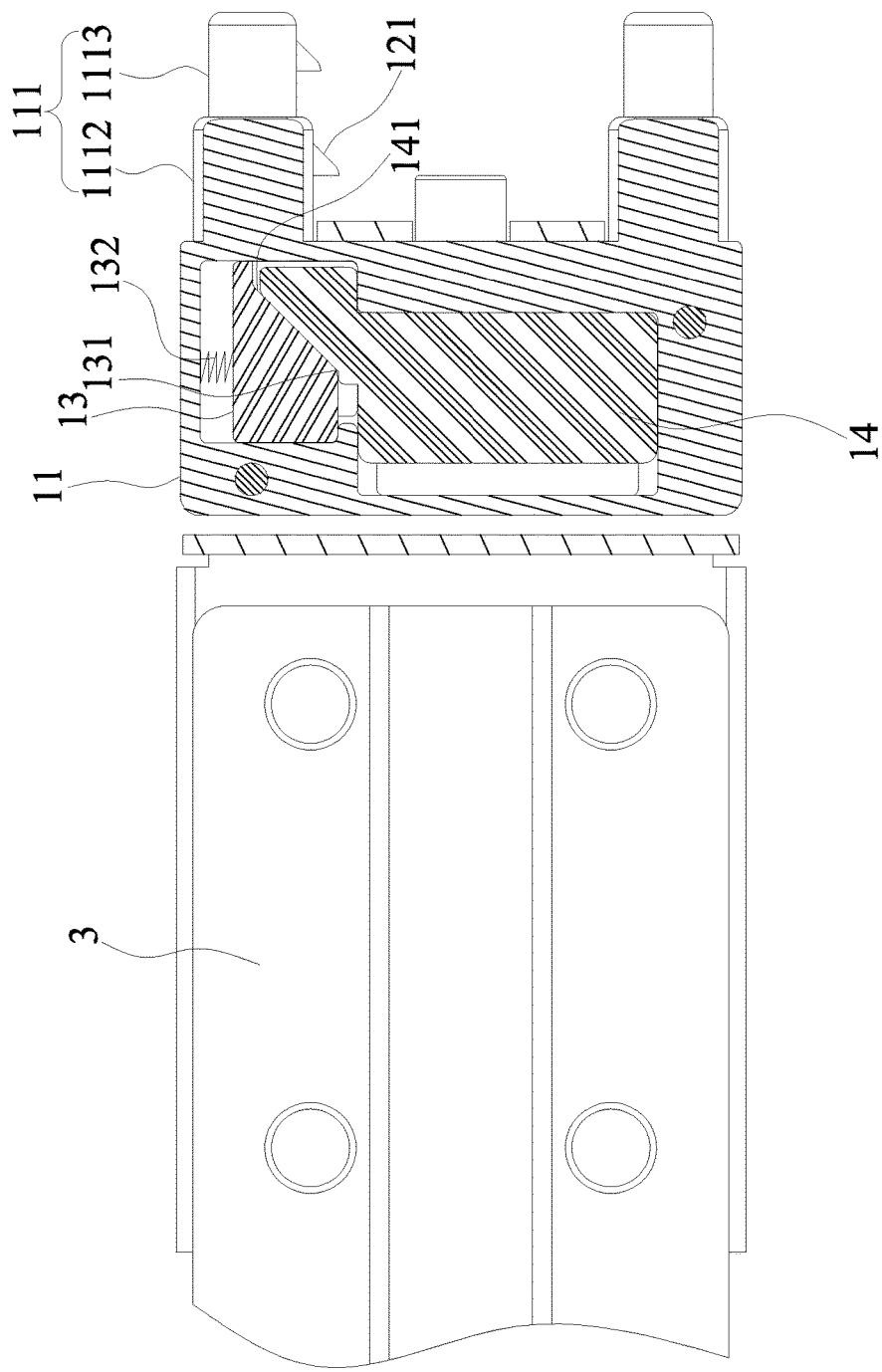
FIG. 3 is a sectional view of a preferred embodiment of the present invention.

The above and other objects, features and advantages of this disclosure will become apparent from the following detailed description taken with the accompanying drawings.

With reference to FIGS. 1, 2, 3 and 4-5 for an exploded view, a perspective view, and a sectional view of a preferred embodiment of the present invention, and schematic views of different operation statuses of an industrial cabinet rail insertable fixing module of the present invention respectively, the insertable fixing module 1 of an industrial cabinet rail has a frame 2 installed at four corners of an industrial cabinet separately, and each vertically erected frame 2 has a plurality of latching holes 21 arranged with an interval apart from each other, and the insertable fixing module 1 of an industrial cabinet rail is installed at an end of the rail 3, so that when the insertable fixing module 1 is set to a horizontal position and installed between the frames 2, and the insertable fixing module 1 of an industrial cabinet rail comprises a main body 11, a hook 12, a linking slider 13 and a press key 14.

Wherein, the main body 11 is substantially a rectangular block structure provided for fixing the front end portion of the rail 3, and the main body 11 has a pair of positioning bumps 111 configured to be corresponsive to the latching holes 21 respectively and arranged with an interval apart from each other, and an accommodating space 112 is formed in the main body 11, and a chute 1111 is formed and extended from one of the positioning bumps 111 in an axial direction, so that the chute 1111 and the accommodating space 112 are communicated with each other. In addition, each positioning bump 111 of the present invention has a two-stage design formed by stacking a first positioning portion 1112 and a second positioning portion 1113, and the first positioning portion 1112 is substantially a rectangular block structure in the shape corresponsive to the rectangular latching holes 21, and the second positioning portion 1113 is substantially a cylindrical structure in the shape corresponsive to the latching holes 21, and the first positioning portion 1112 has a volume greater than the volume of the second positioning portion 1113. In addition, the present invention has an auxiliary positioning column 113 installed on a surface of the main body 11 opposite to the two positioning bumps 111, and the auxiliary positioning column 113 is disposed between the two positioning bumps 111, and the two positioning bumps 111 and the auxiliary positioning column 113 are arranged with an interval apart, and the interval is equal to the interval between the latching holes 21.

The hook 12 is a sheet structure made of a metal plate, and limited and movably installed in the chute 1111, and an end of the hook 12 has two inverted hook portions 121 corresponding to the latching holes 21 respectively, and the other end of the hook 12 is extended into the accommodating space 112 to form a junction 122. It is noteworthy that the two inverted hook portions 121 are disposed at positions corresponsive to the first positioning portion 1112 and the second positioning portion 1113 respectively.

The linking slider 13 is movably installed in the accommodating space 112, and the front end of the linking slider 13 has a combination slot 131 configured to be corresponsive to the hook 12 for installing the junction 122 of the hook 12 into the combination slot 131, and the top of the linking slider 13 has a spring 132 for abutting a side of the accommodating space 112, and the linking slider 13 is abutted and pushed to expose the inverted hook portion 121 of the hook 12 from the positioning bump 111, and the linking slider 13 has a linking slope 133, and the direction of the linking slope 133 is configured to be corresponsive to the contraction direction of the spring 132.

The press key 14 is movably installed in the accommodating space 112, and the press key 14 has a driving slope 141 configured to be corresponsive to the linking slope 133, so that the press key 14 is disposed on a side of the linking slider 13, and the direction of the driving slope 141 is configured to be corresponsive to the moving direction of the linking slider 13, and moving direction of the press key 14 is configured to be corresponsive to the extending direction of the rail 3. In addition, the main body 11 has an operating window 114 formed on a surface of the main body 11 and configured to be corresponsive to the moving space of the press key 14, so that a portion of the press key 14 is exposed from the operating window 114 to facilitate operation.

In addition, the insertable fixing module of an industrial cabinet rail 1 in accordance with the present invention further comprises a fixing rack 15 made by bending a metal plate, and an end of the fixing rack 15 has a plurality of first fixing holes 151 formed thereon and configured to be corresponsive to the rail and provided for fixing the front end of the rail 3, and the other end of the fixing rack 15 is configured to be corresponsive to the main body 11 to form a groove 152, and the groove 152 has a plurality of second fixing holes 1521 formed therein and configured to be corresponsive to the main body 11 for fixing the main body 11 into the groove 152. In other words, the fixing rack 15 may be a fixing rear cover required for assembling the components. In addition, a side of the groove 152 has two positioning plates 153 bent and extended from the main body 11, and each positioning plate 153 has a positioning hole 1531, and the main body 11 has two positioning columns 115 configured to be corresponsive to the two fixing holes 1531. During the installation, the two positioning columns 115 are inserted onto the two fixing plates 153.

Figure 4:
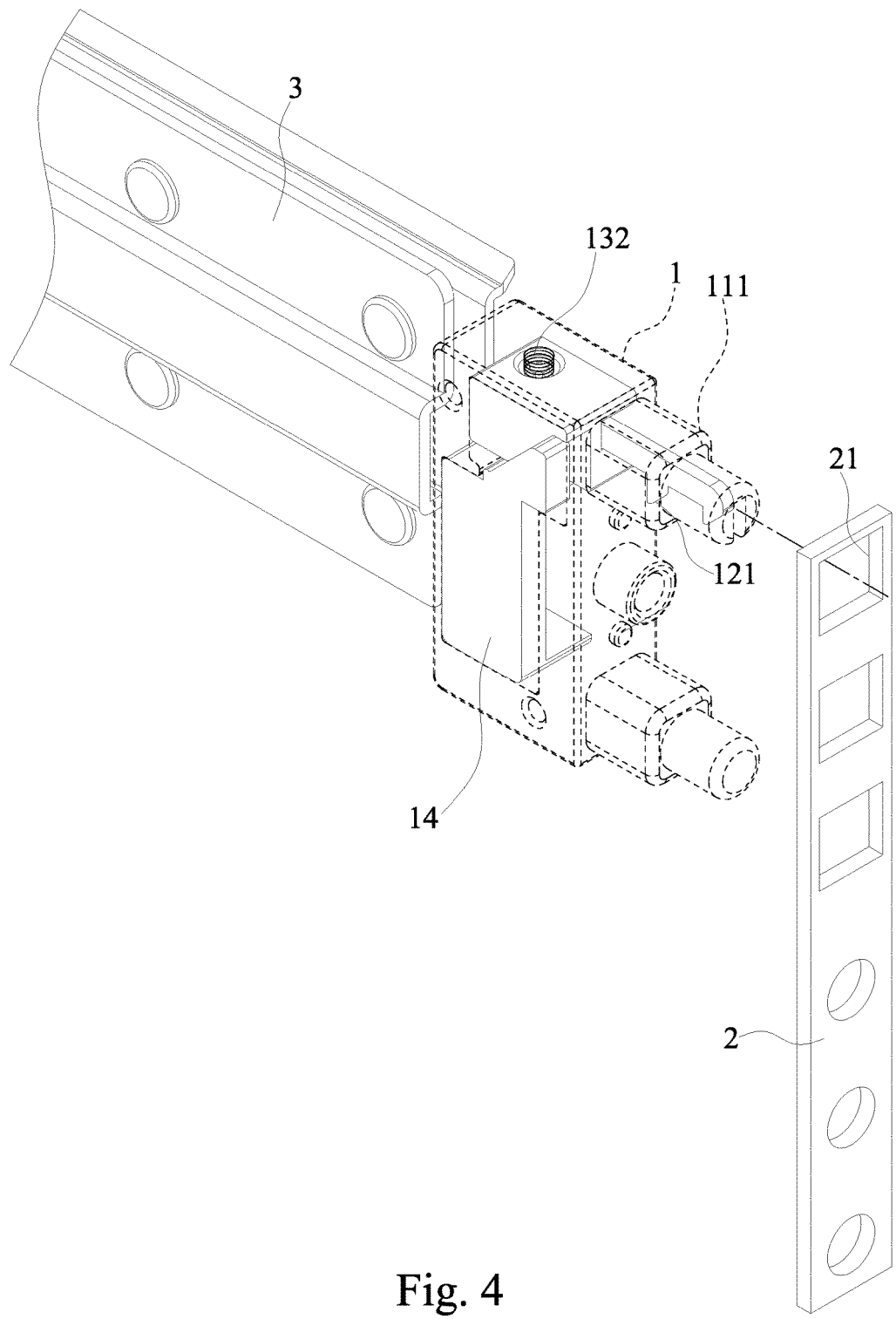
FIG. 4 is a schematic view showing a first operating status of a preferred embodiment of the present invention.
Figure 5:
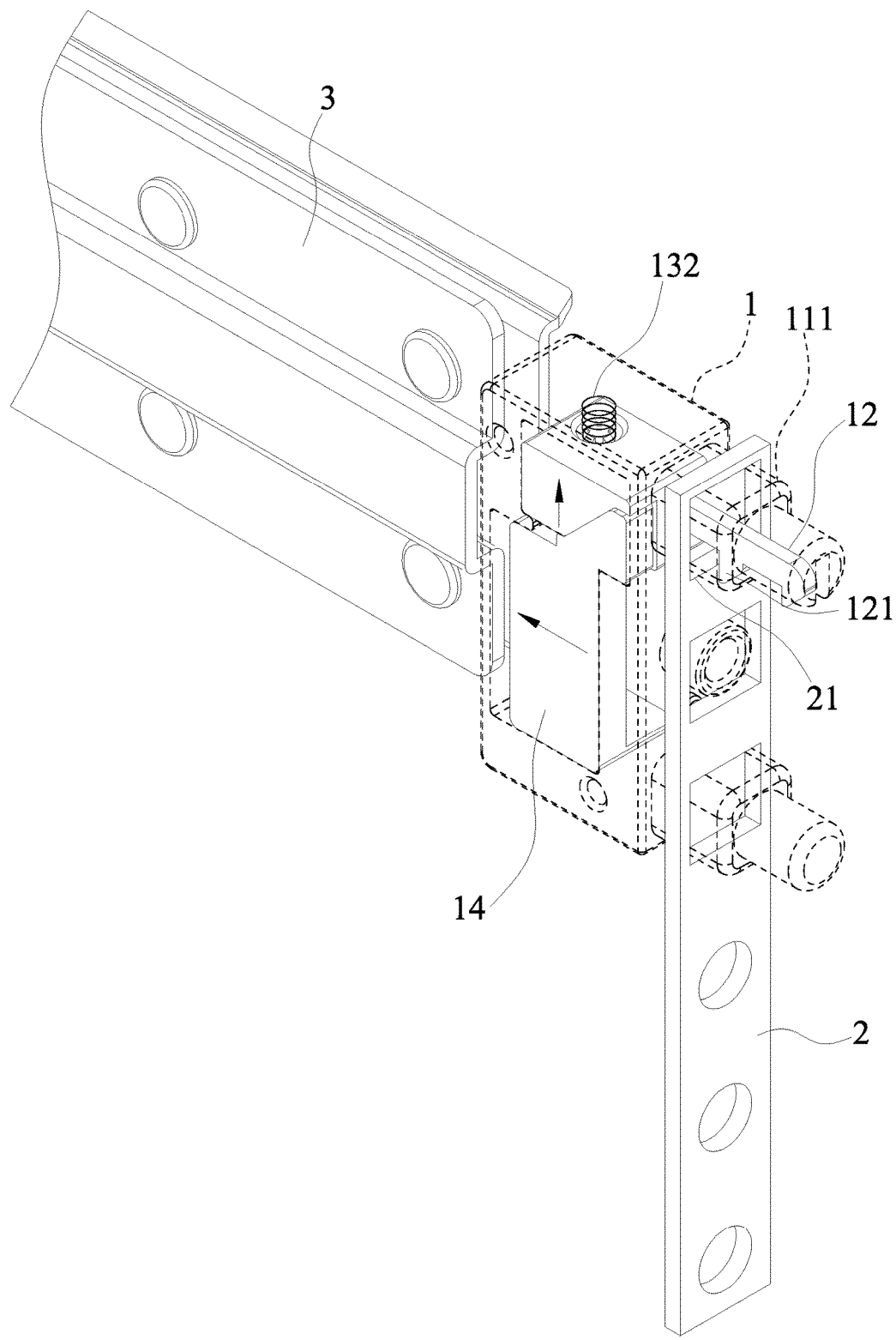
FIG. 5 is a schematic view showing a second operating status of a preferred embodiment of the present invention.

With reference to FIGS. 4 and 5 for the schematic views of the operations in accordance with a preferred embodiment of the present invention respectively, after the insertable fixing module of an industrial cabinet rail 1 is installed to the rail 3 and when the rail 3 is installed to the frame 2, the positioning bumps 111 are aligned precisely with the latching holes 21, and the positioning bump 111 is provided for installing according to the shape of the latching holes 21, and the hook 12 will be passed into the latching hole 21 by the guiding of the slope of the inverted hook portion 121, and the inverted hook portion 121 of the hook 12 is latched to the surrounding of the latching hole 21, and the resilient force of the spring 132 keeps the hook 12 to be normally exposed from the positioning bump 111. When the frame 2 is removed from the rail 3, it is necessary to push the rail 3 inward, so that the press key 14 can be exposed for performing the operation. After an operator presses the press key 14 inwardly in a direction towards the rail 3, the hook 12 is withdrawn into the positioning bump 111 to define a released status, and the rail 3 is removed from the frame 2 to complete the installation and removal quickly.

In summation, the present invention mainly designs the operating side of the press key to be situated at a sliding side of the rail, which cannot be seen from the front side. When the rail is pulled out, the operation cannot be made and an unintentional touch can be prevented. In addition, the design of the press key concavely disposed into the main body can reduce the chance of having the unintentional touch. Compared with the general exposed or front-press fixing structures, the invention achieves the effects of simplifying the internal structure, lowering the manufacturing cost, and improving the scope of applicability effectively.

What is claimed is:

1. An insertable fixing module of an industrial cabinet rail, wherein the industrial cabinet has a frame installed at four corners of the industrial cabinet separately, and the frame has a plurality of latching holes arranged with an interval apart from one another, and the fixing module is installed at an end of a rail facing an outer side of the industrial cabinet, and the fixing module is installed horizontally between the frames, and the insertable fixing module comprises:

a main body, fixed to a front end portion of the rail, and having a pair of positioning bumps configured to be corresponsive to the latching holes respectively and arranged with an interval apart from each other, an accommodating space formed inside the main body, and a chute extended from one of the positioning bumps in an axial direction, so that the chute and the accommodating space are communicated with each other;

a hook, movably installed in the chute, and having at least one inverted hook portion disposed at an end of the hook and configured to be corresponsive to the latching hole, and the other end of the hook being extended into the accommodating space to form a junction;

a linking slider, movably installed in the accommodating space, and having a combination slot configured to be corresponsive to the hook and disposed at a front end of the linking slider, and the junction of the hook being installed into the combination slot, a spring installed to a top side of the linking slider for abutting a side of the accommodating space and abutting the linking slider to expose the inverted hook portion of the hook from the positioning bump, and the linking slider having a linking slope, and a direction of the linking slope being corresponsive to a contraction direction of the spring; and a press key, movably installed in the accommodating space, and having a driving slope configured to be corresponsive to the linking slope, so that the press key is disposed on a side of the linking slider, and a direction of the driving slope being configured to be corresponsive to the moving direction of the linking slider, and the moving direction of the press key being configured to be corresponsive to the extending direction of the rail; thereby, during installation, the pair of positioning bumps are inserted into the two latching holes respectively, and the hook is provided and popped out to define a latched status of fixing the frame; and after the press key is pushed inwardly along the extending direction of the rail, the hook is withdrawn into the positioning bump to define a released status.

2. The insertable fixing module of an industrial cabinet rail according to claim 1, wherein each positioning bump has a two-stage design formed by stacking a first positioning portion and a second positioning portion, and the first positioning portion is corresponsive to the latching holes and substantially a rectangular block structure, and the second positioning portion is substantially a cylindrical structure corresponsive to the latching holes, and the first positioning portion has a volume greater than the volume of the second positioning portion.

3. The insertable fixing module of an industrial cabinet rail according to claim 2, wherein the hook has two inverted hook portions corresponsive to the positioning bump, and the inverted hook portions are corresponsive to the first positioning portion and the second positioning portion respectively.

4. The insertable fixing module of an industrial cabinet rail according to claim 3, further comprising an auxiliary positioning column installed on a side of the two positioning bumps opposite to the main body, and disposed between the two positioning bumps.

5. The insertable fixing module of an industrial cabinet rail according to claim 1, wherein the main body has an operating window formed on a surface of the main body and configured to be corresponsive to the moving space of the press key, so that a portion of the press key is exposed from the operating window.

6. The insertable fixing module of an industrial cabinet rail according to claim 1, further comprising a fixing rack formed by bending a metal plate, and an end of the fixing rack having a plurality of first fixing holes configured to be corresponsive to the rail and provided for fixing to the front end of the rail, and the other end of the fixing rack having a groove formed and configured to be corresponsive to the main body, and the groove having a plurality of second fixing holes formed inside the groove and configured to be corresponsive to the main body for fixing the main body into the groove.

7. The insertable fixing module of an industrial cabinet rail according to claim 6, wherein the groove has two positioning plates formed on a side of the groove and bent and extended from the main body, and each fixing plate has a positioning hole, and the main body has two positioning columns configured to be corresponsive to the two fixing holes, and during installation, the two fixing columns are inserted into the two fixing plates respectively.

* * * * *